(12) United States Patent
White et al.

(10) Patent No.: US 9,887,346 B2
(45) Date of Patent: Feb. 6, 2018

(54) APPARATUS AND ASSOCIATED METHODS

(71) Applicant: Nokia Technologies Oy, Espoo (FI)

(72) Inventors: Richard White, Cambridgeshire (GB); Alan Colli, Cambridge (GB)

(73) Assignee: Nokia Technologies Oy, Espoo (FI)

(*) Notice: Subject to any disclaimer, the term of this patent is extended or adjusted under 35 U.S.C. 154(b) by 289 days.

(21) Appl. No.: 14/432,479

(22) PCT Filed: Oct. 5, 2012

(86) PCT No.: PCT/IB2012/055384
§ 371 (c)(1),
(2) Date: Mar. 30, 2015

(87) PCT Pub. No.: WO2014/053886
PCT Pub. Date: Apr. 10, 2014

(65) Prior Publication Data
US 2015/0287904 A1 Oct. 8, 2015

(51) Int. Cl.
| | |
|---|---|
| H01L 41/113 | (2006.01) |
| H02N 2/00 | (2006.01) |
| B25J 9/12 | (2006.01) |
| B25J 15/02 | (2006.01) |
| H02N 2/18 | (2006.01) |
| G06F 3/041 | (2006.01) |
| H01L 41/04 | (2006.01) |
| H01L 41/047 | (2006.01) |
| H02J 7/00 | (2006.01) |

(52) U.S. Cl.
CPC ............ H01L 41/113 (2013.01); G06F 3/041 (2013.01); H01L 41/042 (2013.01); H01L 41/0478 (2013.01); H02N 2/18 (2013.01); H02N 2/181 (2013.01); H02J 7/0052 (2013.01)

(58) Field of Classification Search
CPC ......... B25J 9/12; B25J 15/0253; H02N 2/004; H02N 2/103; H02N 41/113
USPC ................................................... 310/319, 339
See application file for complete search history.

(56) References Cited

U.S. PATENT DOCUMENTS

| | | |
|---|---|---|
| 5,883,419 A | 3/1999 | Shin |
| 6,433,465 B1 | 8/2002 | Mcknight et al. |
| 2005/0012434 A1 | 1/2005 | Pizzochero et al. |
| (Continued) | | |

FOREIGN PATENT DOCUMENTS

| | | | | |
|---|---|---|---|---|
| CN | 101371375 A | 2/2009 | | |
| CN | 201220557156 U | * 5/2013 | ............. | G01H 11/08 |
| (Continued) | | | | |

OTHER PUBLICATIONS

Berger, et al., "Micromechanical Thermogravimetry", Sep. 18, 1998, Chemical Physics Letters, vol. 294, Issues 4-5, pp. 1-15.*

(Continued)

Primary Examiner — Thomas Dougherty
(74) Attorney, Agent, or Firm — Nokia Technologies Oy

(57) ABSTRACT

An apparatus comprising: —a piezoelectric convertor layer; and —a proximal first piezoresistive layer being in electrical communication with, a first face of the piezoelectric convertor layer, the apparatus being configured such that when the piezoelectric convertor layer is deformed to generate charge, the proximal piezoresistive layer is configured to control the flow of charge from the piezoelectric convertor layer.

21 Claims, 5 Drawing Sheets

(56) References Cited

U.S. PATENT DOCUMENTS

| | | | |
|---|---|---|---|
| 2006/0021261 A1 | 2/2006 | Face | |
| 2006/0176158 A1* | 8/2006 | Fleming | B60R 16/0232 340/425.5 |
| 2010/0148519 A1 | 6/2010 | Shih et al. | |
| 2010/0328984 A1* | 12/2010 | Elmegreen | G11C 11/412 365/72 |
| 2011/0156532 A1 | 6/2011 | Churchill et al. | |
| 2012/0090408 A1 | 4/2012 | Jheng et al. | |
| 2012/0185192 A1 | 7/2012 | Townsend et al. | |
| 2014/0300251 A1* | 10/2014 | Colli | H01L 41/25 310/339 |

FOREIGN PATENT DOCUMENTS

| | | | | |
|---|---|---|---|---|
| CN | 104535229 A | * | 4/2015 | ............ H01L 41/113 |
| JP | 2009-240086 A | | 10/2009 | |
| JP | 2013-545262 A | | 12/2013 | |
| KR | 20120111607 | | 10/2012 | |
| WO | 98/33193 A1 | | 7/1998 | |
| WO | 02/41516 A1 | | 5/2002 | |
| WO | 2006/100331 A2 | | 9/2006 | |
| WO | 2012/042259 A2 | | 4/2012 | |

OTHER PUBLICATIONS

Office action received for corresponding Chinese Patent Application No. 201280076255.5, dated Dec. 27, 2016, 6 pages of office action and no pages of office action translation available.

International Search Report and Written Opinion received for corresponding Patent Cooperation Treaty Application No. PCT/IB2012/055384, dated Jul. 15, 2013, 11 pages.

Extended European Search Report received for corresponding European Patent Application No. 12886083.0, dated May 25, 2016, 7 pages.

Office action received for corresponding Korean Patent Application No. 2015-7011584, dated Jun. 17, 2016, 4 pages of office action and no page of Translation available.

Office action received for corresponding Chinese Patent Application No. 201280076255.5, dated Aug. 19, 2016, 5 pages of office action and no pages of office action translation available.

Zhou et al., "Vertically Aligned Cdse Nanowire Arrays for Energy Harvesting and Piezotronic Devices", ACS Nano, vol. 6, No. 7, 2012, pp. 6478-6482.

"Japan: Producing Electricity from Train Station Ticket Gates", TreeHugger, Retrieved on Apr. 20, 2016, Webpage available at : http://www.treehugger.com/renewable-energy/japan-producing-electricity-from-train-station-ticket-gates.html.

Han et al., "Novel Power Conditioning Circuits for Piezoelectric Micro Power Generators", Nineteenth Annual IEEE of Applied Power Electronics Conference and Exposition, vol. 3, 2004, pp. 1541-1546.

"Piezo Sensor—LDT1-028K Lead Attachments", Measurement Specialties, Retrieved on Apr. 20, 2016, Webpage available at : http://www.meas-spec.com/product/t_product.aspx?id=5435.

Kang et al., "Electromechanical properties of CNT-coated cotton yarn for electronic textile applications", IOP Science Smart Materials and Structures, vol. 20, No. 1, 2011, pp. 1-8.

Bloor et al., "Metal-Polymer Composite With Nanostructured Filler Particles and Amplified Physical Properties", Applied Physics Letter, 88, Mar. 7, 2006. 1 Pages.

Wang et al., "Direct-current Nanogenerator Driven by Ultrasonic Waves", American Association for the Advancement of Science, vol. 316, Apr. 6, 2007, pp. 102-105.

McKay et al., "Soft Generators Using Dielectric Elastomers", Applied Physics Letter, 98, vol. 142903, Apr. 5, 2011, pp. 1-3.

McKay et al., "An Integrated, Self-priming Dielectric Elastomer Generator", Applied Physics Letter, 97, vol. 062911, Aug. 11, 2010, pp. 1-2.

Office action received for corresponding Japanese Patent Application No. 2015-532518, dated Feb. 1, 2016, 3 pages of office action and no page of Translation available.

Xue et al., "Hybridizing Energy Conversion and Storage in a Mechanical-to-Electrochemical Process for Self-Charging Power Cell", American Chemical Society, vol. 12, No. 9, Aug. 9, 2012, pp. 5048-5054.

McKay et al., "Soft generators using dielectric elastomers," American Institute of Physics, 2011, 4 pages.

McKay et al., "An integrated, self-priming dielectric elastomer generator," American Institute of Physics, 2010, 3 pages.

Wang et al., "Direct-Current Nanogenerator Driven by Ultrasonic Waves," Science, vol. 316, Apr. 6, 2007, 5 pages.

* cited by examiner

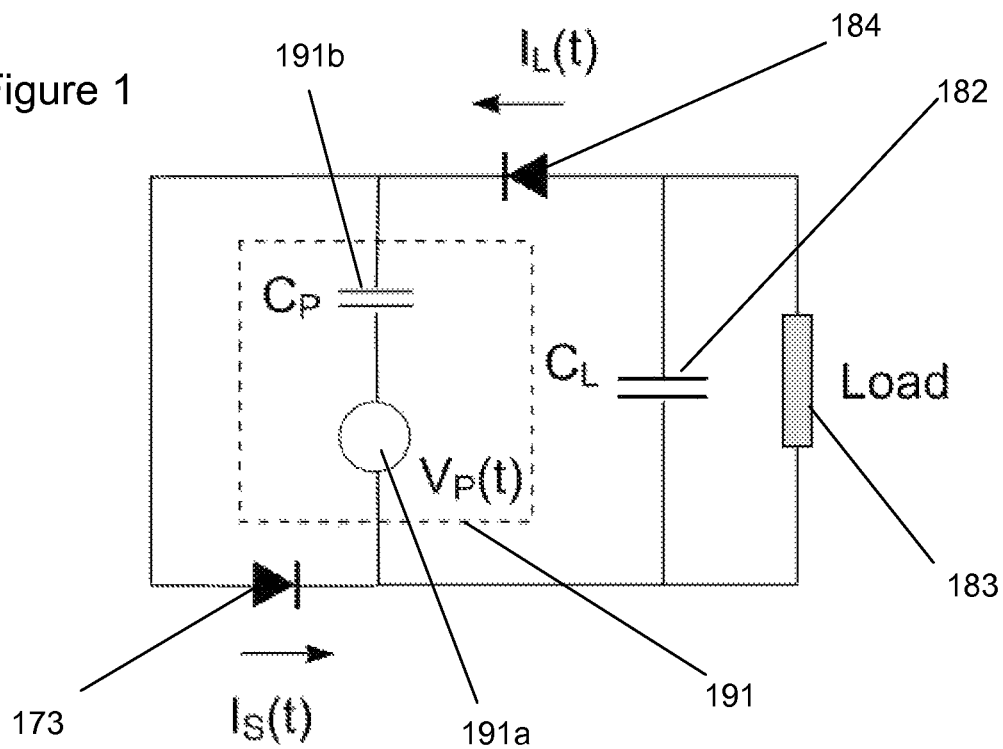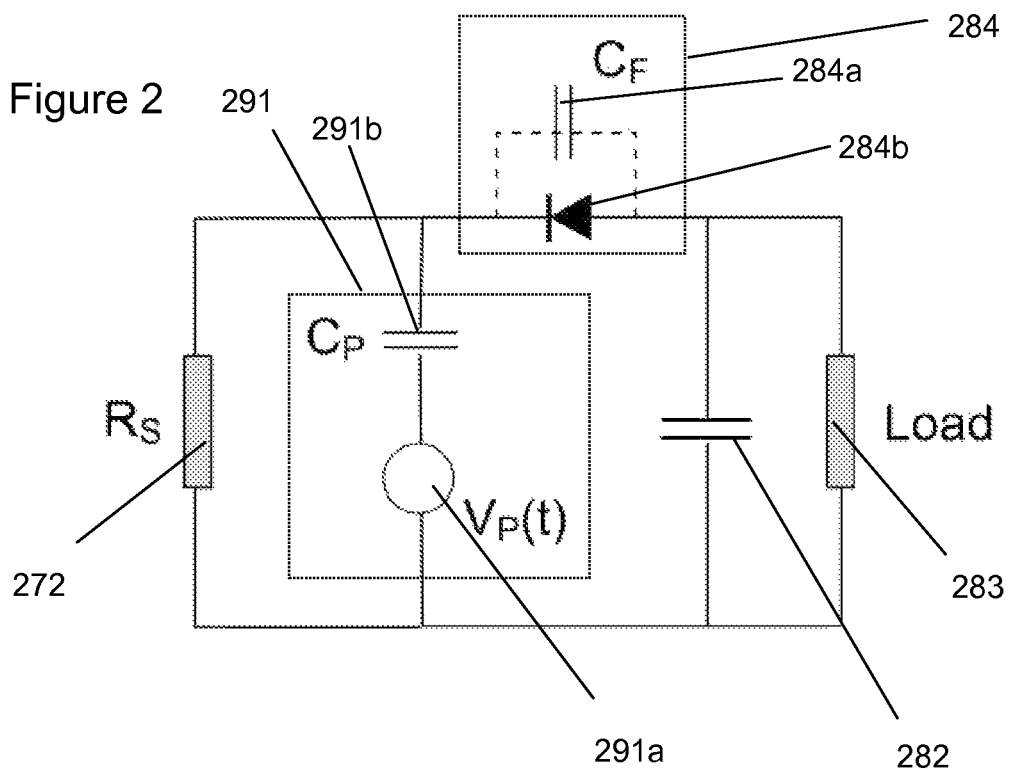

APPARATUS AND ASSOCIATED METHODS

RELATED APPLICATION

This application was originally filed as PCT Application No. PCT/IB2012/055384 filed Oct. 5, 2012.

TECHNICAL FIELD

The present disclosure relates to the field of electronics, associated apparatus and methods, and in particular concerns piezoelectric and piezoresistive materials. Certain disclosed aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs) and/or tablet computers.

The portable electronic devices/apparatus according to one or more disclosed aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Energy harvesting is the process by which energy is derived from external sources (e.g., solar power or kinetic energy) captured, and stored for small, wireless autonomous devices, like those used in wearable electronics and wireless sensor networks.

The apparatus and associated methods disclosed herein may or may not address one or more of these issues.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided an apparatus comprising:
 a piezoelectric convertor layer; and
 a proximal first piezoresistive layer being in electrical communication with, a first face of the piezoelectric convertor layer,
 the apparatus being configured such that when the piezoelectric convertor layer is deformed to generate charge, the proximal piezoresistive layer is configured to control the flow of charge from the piezoelectric convertor layer.

Deformation may encompass any strain applied to a material. Deformation may include one or more of compression, bending, and extension. The piezoelectric convertor layer and/or piezoelectric convertor layer may comprise resilient material to allow them to return to their original shape after being deformed. Deformation may be the result of a stress or force applied to the material/convertor layer.

The proximity (e.g. touching/non-touching, direct/indirect, overlying with/without direct/indirect touch) of the piezoelectric convertor layer and the piezoresistive layer may be such that the electric field generated by the deformation of the piezoelectric convertor layer causes a change the resistance of the piezoresistive layer compared to the non-deformed state to thereby control the flow of charge from the piezoelectric convertor layer. The piezoelectric convertor layer may be considered to be a piezoelectric element.

The apparatus may be configured such that deformation of the piezoresistive layer is not required to cause the change in the resistance of the piezoresistive layer compared to the non-deformed state to thereby control the flow of charge from the piezoelectric convertor layer.

The proximity of the piezoelectric convertor layer and the piezoresistive layer may be such that they are in physical (e.g. direct/indirect) contact so that the deformation of the piezoelectric convertor layer causes a deformation in the piezoresistive layer to change the resistance of the piezoresistive layer compared to the non-deformed state to thereby control the flow of charge from the piezoelectric convertor layer. The proximity of the piezoelectric convertor layer and the piezoresistive layer may be such that they are in physical (e.g. direct/indirect) contact so that the deformation of the piezoresistive layer causes a deformation in the piezoelectric convertor layer, the deformation changing the resistance of the piezoresistive layer compared to the non-deformed state to thereby control the flow of charge from the piezoelectric convertor layer.

The apparatus may be configured such that the resistance of the first piezoresistive layer decreases in response to mechanical stress (e.g. compression) applied to the piezoelectric convertor layer.

The first piezoresistive layer may comprise a conductor-insulator composite material. A conductor-insulator composite may be a composite of conducting elements (e.g. metal) and insulating material (e.g. polymeric binder). They may utilise percolation through a continuous conducting network or quantum tunneling: without deformation (e.g. compression), the conductive elements are such that they are too far apart to conduct electricity; when pressure is applied, the conductive elements may move closer together and electrons can tunnel through the insulator or if the conductive elements come into direct contact then the electrons can directly flow from one conductive element to another. The piezoresistive layer may, for example, comprise: carbon nanotube/polydimethylsiloxane (PDMS) composites; metal nanoparticle/polymer composites; graphene/carbon nanotube (CNT)/polymer composites; force sensitive rubber; and/or quantum tunneling composites (QTC).

The first piezoresistive layer may comprise doped graphene in (e.g. direct) contact with the piezoelectric convertor layer, the resistance of the doped graphene being configured to change in response to an electric field being generated by the piezoelectric convertor layer in response to deformation. It may be, under such a situation, that actual deformation of the first piezoresistive layer is not required to control the flow of charge (by changing of the resistance of the doped graphene). In such a case, the first piezoresistive layer may not strictly be considered to be piezoresistive as actual deformation is not required to provide for the change in resistance.

An n-doped graphene layer in contact with a piezoelectric conductor layer surface which becomes negatively charged under mechanical stress (e.g. compression) or a p-doped graphene layer in contact/proximity with a piezoelectric conductor layer surface which becomes positively charged under mechanical stress (e.g. compression) will act as a positive piezoresistive layer (even though actual compression of the doped graphene layer may not be required). Conversely, a p-doped graphene layer in contact/proximity with a piezoelectric conductor layer surface which becomes negatively charged under mechanical stress (e.g. compression) or an n-doped graphene layer in contact with a piezoelectric conductor layer surface which becomes positively charged under mechanical stress (e.g. compression) will act as a negative piezoresistive layer (even though actual compression of the n-doped graphene layer may not be required).

The piezoelectric convertor layer and the first piezoresistive layer may be configured to be transparent.

The extent of the piezoresistive layer may be smaller than the extent of the piezoelectric convertor layer. For example the surface area of the piezoresistive layer may be smaller than the surface area of the piezoelectric convertor layer. This may allow the capacitance of the piezoresistive layer to be reduced with respect to the capacitance of the piezoelectric convertor layer.

The apparatus may comprise a plurality of discrete, spaced apart first piezoresistive layers arranged in proximity with a common piezoelectric convertor layer. This may allow for individual pixels to be separately activated and/or the capacitance of each discrete piezoresistive layer to be reduced with respect to the capacitance of the piezoelectric convertor layer.

The piezoelectric convertor layer may comprise:
a piezoelectric layer;
a first conducting layer in direct electrical communication with the first face of a piezoelectric layer; and
a second conducting layer in direct electrical communication with the opposing second face of the piezoelectric layer.

The apparatus may comprise:
a first circuit portion electrically connected to:
the first face of the piezoelectric convertor layer via the first piezoresistive layer; and
the opposing second face of the piezoelectric convertor,
the first circuit portion being configured to store charge generated by the piezoelectric convertor layer; and
a second circuit portion connected to:
the first face of the piezoelectric convertor layer; and
the opposing second face of the piezoelectric convertor layer,
the second circuit portion being configured to enable charge to be equalized between the opposing first and second faces of the piezoelectric convertor layer.

The first circuit portion may comprise a storage capacitor, super-capacitor or battery configured to store the charge from the piezoelectric convertor layer. The capacitance of the storage capacitor may be greater than the intrinsic capacitance of the piezoelectric convertor.

The second circuit may comprise a resistor, the resistor being configured to resist charge equalization between the opposing first and second faces of the piezoelectric convertor layer.

The apparatus may be configured such that:
the resistance of the first piezoresistive layer is less than the resistance of the resistor when the piezoelectric convertor layer is mechanically stressed (e.g. compressed); and
the resistance of the first piezoresistive layer is greater than the resistance of the resistor when the piezoelectric convertor layer is not mechanically stressed.

A piezoresistive layer may comprise a positive piezoresistive material or a negative piezoresistive material. A positive piezoresistive material is a material whose conductivity increases (and resistance decreases) upon the application of mechanical stress (e.g. compression). Conversely, the conductivity of a negative piezoresistive material decreases (resistance increases) upon the application of mechanical stress (e.g. compression). Preferably the piezoresistive material has a high ON/OFF ratio; e.g. a positive piezoresistive material may be an insulator at rest, and a good conductor under pressure.

The apparatus may comprise a second piezoresistive layer overlying/in proximity with, and being in electrical communication with, the opposing second face of the piezoelectric convertor layer.

The apparatus may be configured such that the resistance of the second piezoresistive later increases in response to mechanical stress (e.g. compression) of the piezoelectric convertor layer.

The second piezoresistive layer may comprise doped graphene in (e.g. direct) contact with the piezoelectric convertor, the resistance of the doped graphene being configured to change in response to an electric field being generated by the piezoelectric convertor in response to deformation.

The apparatus may comprise:
a first circuit portion electrically connected to:
the first face of the piezoelectric convertor layer via the first piezoresistive layer; and
the opposing second face of the piezoelectric convertor,
the first circuit portion being configured to store charge generated by the piezoelectric convertor layer; and
a second circuit portion connected to:
the first face of the piezoelectric convertor layer; and
the opposing second face of the piezoelectric convertor layer via the second piezoresistive layer,
the second circuit portion being configured to enable charge to be equalized between the opposing first and second faces of the piezoelectric convertor layer.

The apparatus may be or may form part of a touch screen, a touch screen pixel, a shoe, a watch, an item of clothing, a portable electronic device, or a mechanical energy collecting device.

According to a further aspect, there is provided a method of manufacturing an apparatus, the method comprising providing:
a piezoelectric convertor layer; and
a proximal first piezoresistive layer being in electrical communication with, a first face of the piezoelectric convertor layer,
the apparatus being configured such that when the piezoelectric convertor layer is deformed to generate charge, the proximal piezoresistive layer is configured to control the flow of charge from the piezoelectric convertor layer.

According to a further aspect, there is provided a method of using an apparatus, the apparatus comprising
a piezoelectric convertor layer; and
a proximal first piezoresistive layer being in electrical communication with, a first face of the piezoelectric convertor layer,
the apparatus being configured such that when the piezoelectric convertor layer is deformed to generate charge, the proximal piezoresistive layer is configured to control the flow of charge from the piezoelectric convertor layer.

the method comprising:

deforming the piezoelectric convertor layer such that the piezoelectric convertor layer generates a charge and the first piezoresistive layer controls a flow of the generated charge from the piezoelectric convertor layer.

According to a further aspect, there is provided a computer program for controlling the making of an apparatus, the computer program comprising computer code configured to control one or more of:

providing a piezoelectric convertor layer; and providing a proximal first piezoresistive layer being in electrical communication with, a first face of the piezoelectric convertor layer, such that when the piezoelectric convertor layer is deformed to generate charge, the proximal piezoresistive layer is configured to control the flow of charge from the piezoelectric convertor layer.

The computer program may be stored on a storage media (e.g. on a CD, a DVD, a memory stick or other non-transitory medium). The computer program may be configured to run on a device or apparatus as an application. An application may be run by a device or apparatus via an operating system. The computer program may form part of a computer program product.

The present disclosure includes one or more corresponding aspects, embodiments or features in isolation or in various combinations whether or not specifically stated (including claimed) in that combination or in isolation. Corresponding means of functional units for performing one or more of the discussed functions are also within the present disclosure.

Corresponding computer programs for implementing one or more of the methods disclosed are also within the present disclosure and encompassed by one or more of the described embodiments.

The above summary is intended to be merely exemplary and non-limiting.

BRIEF DESCRIPTION OF THE FIGURES

A description is now given, by way of example only, with reference to the accompanying drawings, in which:

FIGS. 1 and 2 depict simple general models for two piezoelectric energy-harvesting devices;

DESCRIPTION OF SPECIFIC ASPECTS/EMBODIMENTS

Figure 3A:
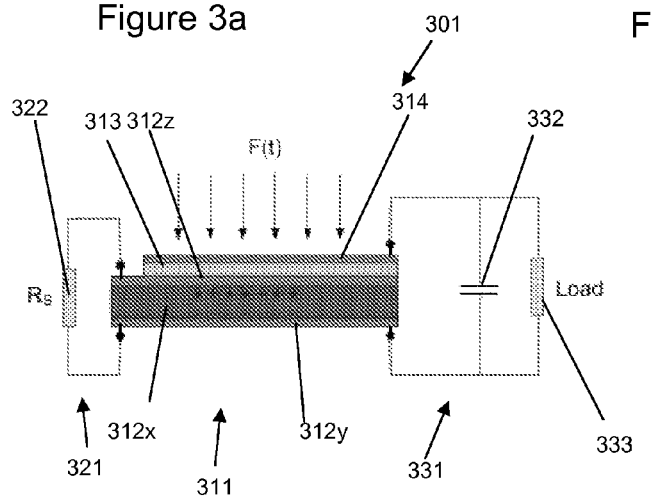
FIGS. 3a and 3b show an energy-harvesting device based using a single layer of piezoresistive material and the corresponding equivalent circuit.

The piezoelectric effect converts mechanical strain into an electric field, which in turn may create an electric current or voltage. This strain can come from many different sources, such as human motion, low-frequency seismic vibrations, or acoustic noise. Most piezoelectric electricity sources produce power on the order of milliwatts, too small for system application, but enough for some classes of wireless autonomous devices and self-powered mechanical sensors.

FIGS. 1 and 2 show prior art implementations of piezoelectric energy harvesting devices, each of which have at least one diode 184, 173, 284 (two are in FIG. 1, and one is shown in FIG. 2) as a necessary component to control flow of current to different portions of the circuit. The use of such diode components, however, may be in many cases limiting and inconvenient.

The circuit as shown in FIG. 1 comprises a piezoelectric convertor 191 (e.g. comprising a layer of piezoelectric material sandwiched between two metallic plates) configured to generate an electric field in response to being mechanical stressed (e.g. compression). The piezoelectric convertor 191 may be modelled by a voltage generator $V_P$ 191a and a capacitor $C_P$ 191b in series. The circuit further comprises a storage capacitor $C_L$ 182 configured to store charge for driving the load 183. The circuit also comprises two diodes, 184 and 173, configured to charge and discharge the capacitance $C_P$ 191b of the piezoelectric convertor through different electrical paths. This results in a net charge being stored in the load capacitor $C_L$ at every piezo-cycle (e.g. a compression followed by a release). In this case, it is assumed that $C_L \gg C_P$. When $C_L$ 182 is charged, it can power the load 183 with a relatively stable voltage in between cycles, even if the cycles are strongly irregular in rate and intensity. As the voltage $V_P$ generated by the piezoelectric convertor may be modelled as an alternating voltage, an energy harvesting device based on such element may include additional circuitry to rectify the signal from the piezoelectric convertor and store it in a battery or capacitor. The rectification, in this case, is performed by the diodes.

A simpler geometry is illustrated in FIG. 2. The circuit of FIG. 2 is similar to that of FIG. 1 except that one of the diodes is replaced with a resistor 272 ($R_S$). The principle of operation is the same as for FIG. 1, provided the following conditions are met:

(i) $R_S$ is (much) larger than the resistance of the diode in forward bias (so that in forward bias the bulk of the current comes from the diode path); and (ii) $R_S$ is small enough to allow full charging/discharging of $C_P$ in reverse bias at every cycle.

For example, in the case of the source being some human-compatible motion, (e.g. 10 Hz maximum cycle frequency), during which a stress is applied for 50 ms minimum per cycle. Above a voltage threshold, a standard commercial diode exhibits a resistance between 100 Ω and 10 kΩ. For a polyvinylidene difluoride (PVDF) piezoelectric convertor a few cm² in area, capacitance is usually 1-10 nF. Hence, the charging of capacitor 291b $C_P$ through the diode occurs in around 0.1 ms (time constant=RC=10 kΩ×10 nF). That means that $R_S$ should be from around 100 kΩ to 1 mΩ (because still 1 MΩ×10 nF<50 ms).

Note that FIG. 2 emphasizes another important consideration: every diode has an intrinsic internal capacitance 284a that can be modelled as $C_F$. $C_F$ should be less than $C_P$, to mitigate charge being transferred between $C_P$ and $C_F$ at every cycle (i.e. rather than to the storage capacitor 282). That is, if no current is forced through the diode in forward bias, no "charge pumping" to the storage capacitor occurs.

In some combinations, the diode may not have the dynamic range to transmit the voltages produced by the piezoelectric. For example, polyvinylidene difluoride (PVDF) piezoelectric converters may output a voltage between 10 mV and 100 V, according to the stress applied. Conventional silicon diodes have a threshold voltage of roughly 0.6 V, meaning that any signal or energy below that threshold will be lost. This may limit diode piezo-systems when harvesting or detecting small to moderate stress such as light vibrations or a finger touch. At the other extreme, at 10-100V the diode may withstand a significant current. Hence, to cover up for potential high-voltage spikes, bulky high-power diodes may be used, which may be unnecessarily costly if the piezo-system is dealing with small signals for most of the time.

A second consideration is circuit integration. The size of the integration may be smaller as the external diodes may be removed. For example, fitting one diode per shoe may be manageable, but this is may be difficult/expensive/complicated for a touch screen/panel made of several piezo-pixels.

The present disclosure relates to providing for the controlling of charge flow in piezo-systems for mechanical energy harvesting and sensing with a piezoresistive layer assembled on top of the piezoelectric convertor (e.g. so that both can experience the same applied stress at the same time).

According to embodiments of this disclosure, the piezo-energy/mechanical energy harvester/collector may be able to harvest/collect energy from smaller strains applied to the piezoelectric convertor. Further, the harvesters could be smaller in size but still able to harvest energy to be stored for future use. Further advantages may include a wider dynamic range, no threshold voltage, and easier manufacturability.

The apparatus according to the present disclosure may be applicable to a broad range of applications, which may include: integration into shoes for energy harvesting from walking/running; integration into chairs or clothes for energy harvesting from movement; a self-powered touch screen; self-powered wireless sensors (e.g., automotive-powered sensors in tyres); devices to harvest wind energy; devices integrated into flooring to harvest energy from people walking; integration with an inertial mass to harvest energy from accelerations; and integration within the body of a device to harvest energy from squeezing.

Figure 3B:
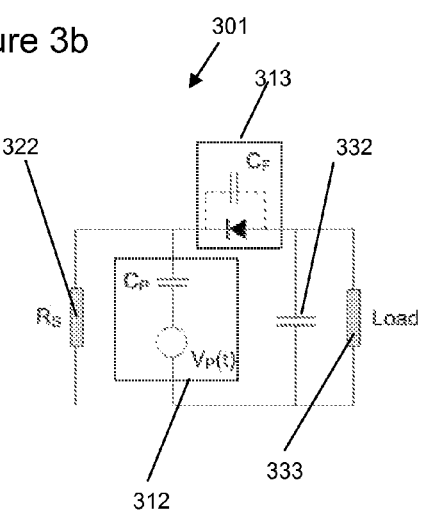

An embodiment 301 of a piezo-electric harvester/apparatus is shown in FIG. 3a, together with the corresponding equivalent circuit (FIG. 3b). The embodiment comprise: a piezoelectric convertor layer 312; and a proximal first piezoresistive layer 313 (which in this case is a positive piezoresistive layer) being in electrical communication with, a first face of the piezoelectric convertor layer, such that when the piezoelectric convertor layer 312 is deformed to generate charge, the proximal piezoresistive layer 313 is configured to control the flow of charge from the piezoelectric convertor layer.

In this case, the proximity of the piezoelectric convertor layer 312 and the piezoresistive layer 313 is such that they are in direct physical contact so that the deformation of the piezoelectric convertor layer causes a deformation in the piezoresistive layer to change the resistance of the piezoresistive layer compared to the non-deformed state to thereby control the flow of charge from the piezoelectric convertor layer.

The first piezoresistive layer in this case is a positive piezoresistive layer. That is, the resistance of the first piezoresistive layer, which in this case is a metal-insulator composite, decreases in response to mechanical stress. The positive piezoresistive layer is coated with a conducting layer 314 to enable an electrical connection with other circuit portions.

In this case, the piezoelectric convertor layer comprises: a piezoelectric layer 312x; a first conducting layer 312z (e.g. a metallic layer) in direct electrical communication with the first face of a piezoelectric layer; and a second conducting layer 312y (e.g. a metallic layer) in direct electrical communication with the opposing second face of the piezoelectric layer. It will be appreciated that one or more of the conducting layers may not be metallic. For example, a conducting layer may comprise graphene film.

Because the piezoresistive layer is integrated with the piezoelectric convertor layer, the layered structure 311 comprising the piezoelectric convertor 312 and the piezoresistive layer 313 may be manufactured as a single laminated foil without any external circuitry, for example using roll-to-roll production.

The layered structure 311 is connected to two circuit portions: an equalizing circuit portion 321 comprising a resistor 322; and a storage circuit portion 331 comprising a storage capacitor 332. The storage circuit portion 331 is electrically connected to: the first face of the piezoelectric convertor layer 312 via the first piezoresistive layer 314; and the opposing second face of the piezoelectric convertor, the first circuit portion being configured to store charge generated by the piezoelectric convertor layer. The equalizing circuit portion 322 is connected to: the first face of the piezoelectric convertor layer; and the opposing second face of the piezoelectric convertor layer, the second circuit equalizing portion being configured to enable charge to be equalized between the opposing first and second faces of the piezoelectric convertor layer. These circuit portions may be external circuit portions or integrated with the layered structure.

As stress or force F(t) is applied to the piezoelectric converter layer, a field forms at both faces of the piezoelectric material 312x, resulting in an accumulation of charge in the two conducting layers 312y, 312z forming a parallel-plate capacitor. Since, when under pressure, the positive piezoresistive layer 313 conducts better than the equalizing circuit portion 321 resistor 322 $R_S$, current flows principally in the right storage branch 331 of the circuit, and the piezo-capacitor $C_P$ (representing the intrinsic capacitance of the piezoelectric convertor layer) can charge up only by moving charge to/from the storage capacitor 332 $C_L$ (current through the higher-impedance load 333 may be negligible). When the stress/force is released, the electric field holding the charge on the conducting plates is removed and so the charge should dissipate or discharge, but it cannot do so via the right storage circuit portion 331 which is blocked because the positive piezoresistive layer 313 has reduced conductivity. However, the left equalizing branch 321 of the circuit (which does not incorporate the positive piezoresistive layer) remains available for discharging the conducting plates 312y, 312z of the piezoelectric convertor layer 312. That is, resistance of the piezoresistive layer, $R_P$, under stress satisfies $R_P \ll R_S$ and when unstressed satisfies $R_S \ll R_P$.

It can then be seen that the equivalent circuit of this device is analogous to that in FIG. 2, with the diode being replaced by the positive piezoresistive layer 313. It will be appreciated that the positive piezoresistive layer 313 may be considered to be a diode in the respect of the use described above. However, a piezoresistive layer may not be directly equivalent to an electrical diode, as its conductivity imbalance is driven by mechanical stress and not by the electrical bias applied across it. However, in this particular apparatus, any reverse in bias always occurs in phase with the application of stress. Therefore, the piezoresistive layer is found in the conductive state for one current polarity only, mimicking the behaviour of a semiconductor diode. The piezoresistive layer may also be considered to be a pressure activated switch which is opened and closed at the same time as the piezoelectric convertor is mechanical stressed (e.g. compressed) and realised.

In order for the apparatus in FIG. 3 to work more efficiently as an energy harvester: the internal capacitance of the "diode" ($C_F$), or diode equivalent (piezoresistive layer 313 in this case), should be smaller than $C_P$ (the smaller the better for this circuit). As in this case, for piezoelectric convertor layers comprising polyvinylidene difluoride (PVDF) as the piezoelectric material, $C_P$ may be of the order of 1 nF/cm$^2$. As shown in FIG. 3a, the polyvinylidene difluoride (PVDF) capacitor and the parallel capacitance associated with the piezoresistive layer may share substantially the same area, so their capacitance may be very similar. Moreover, the thickness of an average piezoresistive layer may be 5-10 μm, while the polyvinylidene difluoride (PVDF) may be 20-50 μm in thickness (capacitance is generally inversely proportional to the dielectric thickness). Finally, the dielectric constant of polyvinylidene difluoride (PVDF) is ~12, while that of insulator-conductor composite is unlikely to be much smaller. Therefore to improve the function of the device the capacitance of the piezoresistive layer may be decreased relative to the piezoelectric convertor layer.

Figure 4:
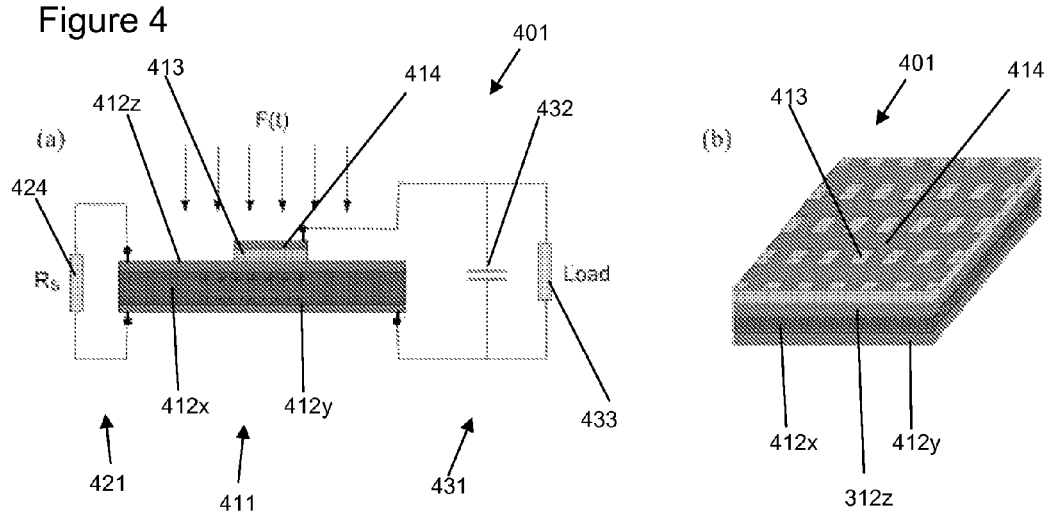
FIG. 4a-4b is respectively a cross-section and a perspective view of a further energy-harvesting device suitable for use in pixelated embodiments.

One solution to reduce the capacitance of the piezoresistive layer relative to the piezoelectric convertor layer may be reducing the area of the piezoresistive layer relative to the corresponding piezoelectric convertor layer achieving a corresponding decrease in capacitance. Such an embodiment 401 is shown in FIG. 4a. The embodiment of FIG. 4a is the same as FIG. 3a except that the area of the piezoresistive layer is reduced compared with the area of the piezoelectric convertor layer. Likewise, the conducting layer 414, which enables an electrical connection between the positive piezoresistive layer and other circuit portions, is correspondingly reduced in size. This approach may be particularly effective in some cases (e.g. touchpanel pixels). It will be appreciated that the smaller piezoresistive layers should be positioned such that the same applied stress which activates the piezoelectric convertor layer also activates the change of resistance in the piezoresistive later. Likewise, the piezoresistive layer area should not be made so small that the resistance of the layer is too large to enable current to pass when in a conducting state.

It will be appreciated that a number of piezoresistive layer pixels may be arranged on the surface of the piezoelectric convertor layer as shown in FIG. 4b (e.g. forming a grid). This may allow the system to work effectively even if the pressure is not applied uniformly over the whole device area. The geometry of the grid may have an impact on a low capacitance and a low ON resistance for the piezoresistive layer and may allow large enough currents to be supported. The size and spacing of the discrete pixels depend on the application. For example, pixels for a touchscreen may be in the 1-10 mm range, with spacing between adjacent pixels of between 1 micron-1 mm whereas discrete pixels for a carpet footfall energy harvester may be up to several tens of cm with large spaces between adjacent discrete pixels (e.g. up to 1 meter).

From the discussion above, a value of $R_S$ in the 0.1-10 MΩ range may be optimal for most applications. To implement $R_S$, even in a fully integrated "soft" (e.g. a flexible, stretchable, and/or deformable) device the two conducting layers of the piezoelectric convertor layer may be connected with a piece of highly resistive polymer or adhesive tape.

Figure 5:
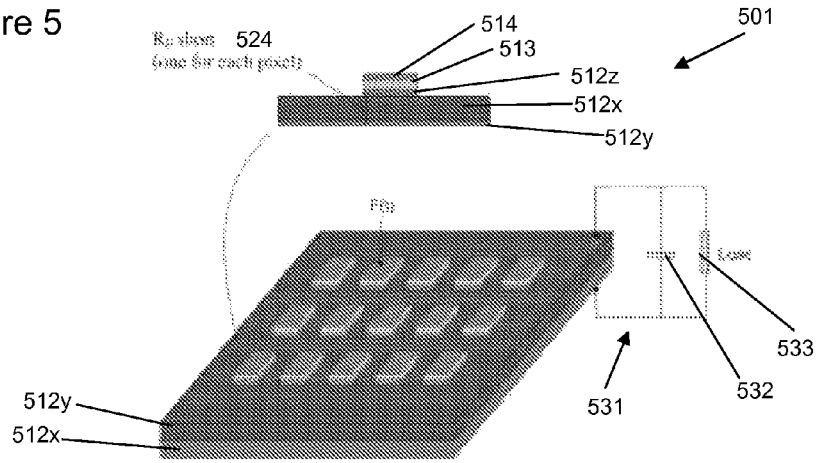
FIG. 5 depicts a further pixelated embodiment based on piezoresistive materials.

FIG. 5 depicts an alternative pixelated (discretised) embodiment 501 where the pixels (discrete units) are configured to work collectively. The structure of the layers of this embodiment is similar to that of FIG. 4a. Unlike the embodiment of FIG. 4a, the area of the conducting layer 512z positioned proximally to the top surface of the piezoelectric layer 512x does not extend over the entire top surface, but corresponds with the area of the piezoresistive layer pixels. That is, pixelation starts from the conducting layer 512z, while the first conducting layer 512y and the piezoelectric layer 512x can be shared as continuous bulk layers. The load resistor 524 is incorporated within the layer structure 511 by connecting between the two conducting layers 512y, 512z of the piezoelectric convertor layer through the piezoelectric convertor layer. As shown in the perspective view, shared electrode lines converging to the storage circuit 531 are connected to the topmost electrode conducting layer of each pixel. The storage circuit in this case comprises a storage capacitor 532 for storing charge generated and a load resistor 533 which represents a load.

Such an embodiment may be incorporated into a piezoelectric carpet as shown in FIG. 5, to harvest energy from footsteps. Assuming the carpet covers an entire room and a person is walking on it, it is possible to harvest some energy only if the carpet is made of an array of piezo-generators, with the individual "pixel" being as close as possible to the footprint size. If the carpet is made of a large, single pixel only, the charge induced locally by the step will face the enormous parasitic capacitance of the inactive surface, which will hinder any energy output (signal dies as ~foot area/room area). Pixel sizes may be generally in the range of between 1 mm$^2$ and 1 m$^2$ depending on the application. Similarly, depending on the application, the spacing between adjacent tiles may be between 1 micron and 1 m. In the present carpet case the pixel "tiles" may be up to several tens of cm.

In an array of independent mechanical energy harvesters based on piezoelectric convertors, every pixel needs its own diode or diode equivalent to control the flow of charge. An advantage offered by this embodiment compared to the use of conventional diodes is that, while diodes need to be assembled, a piezoresistive layer can be printed over large areas on a flexible "carpet" that can be easily rolled up when needed. This may reduce manufacturing costs and make a simpler design.

In this case the piezoelectric material is polyvinylidene difluoride (PVDF). It will be appreciated that other piezoelectric materials may be used. For example, the piezoelectric material may comprises a ceramic like lead zirconate titanate (PZT) or ZnO. Other materials which may be suitable to be used as a piezoelectric material include nanowire-based composites.

Figure 6A:
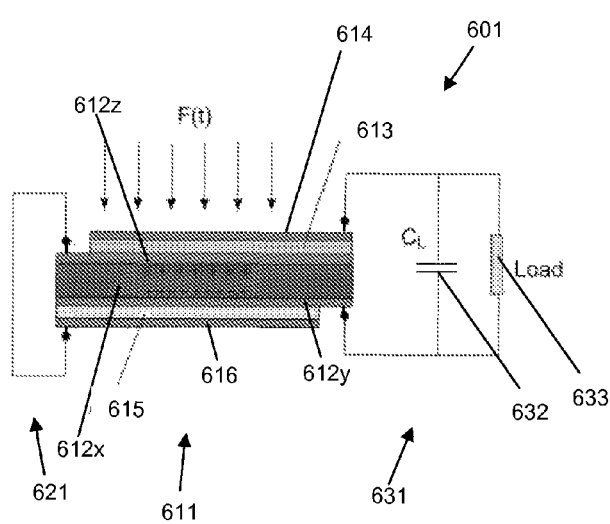
FIGS. 6a and 6b depict a further energy-harvesting device based on piezoresistive materials and the corresponding equivalent circuit.
Figure 6B:
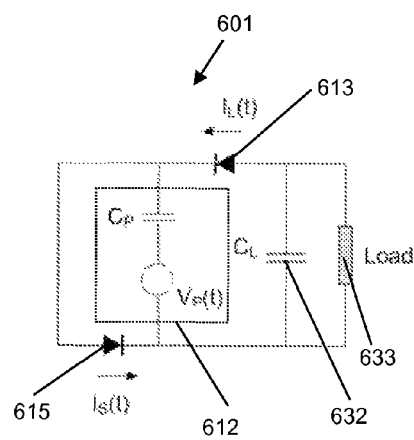

A further embodiment 601 is shown in FIG. 6a, together with the corresponding equivalent circuit (FIG. 6b). The embodiment comprises: a piezoelectric convertor layer 612 (612x, 612y and 612z); and a proximal first piezoresistive layer 613 (which in this case is a positive piezoresistive layer) being in electrical communication with, a first face of the piezoelectric convertor layer, such that when the piezoelectric convertor layer is deformed to generate charge, the proximal piezoresistive layer is configured to control the flow of charge from the piezoelectric convertor layer; and a second piezoresistive layer 615 overlying (in proximity with), and being in electrical communication with, the opposing second face of the piezoelectric convertor layer 612. In this case, the second piezoresistive layer is a negative piezoresistive layer configured such that the resistance of the second piezoresistive layer increases in response to mechanical stress (e.g. compression) of the piezoelectric convertor layer.

This embodiment further comprises two circuit portions: a first storage circuit portion 631 electrically connected to: the first face of the piezoelectric convertor layer 612 (612x, 612y and 612z) (i.e. the surface which is in contact with the piezoresistive layer) via the first piezoresistive layer 613; and the opposing second face of the piezoelectric convertor layer (i.e. the surface of the piezoelectric convertor layer on the opposite side to the first face), the first circuit portion 631 being configured to store charge generated by the piezoelectric convertor layer 612; and a second equalizing circuit portion 621 connected to: the first face of the piezoelectric convertor layer 612; and the opposing second face of the piezoelectric convertor layer via the second negative piezoresistive layer 615, the second circuit portion being configured to enable charge to be equalized between the opposing first and second faces of the piezoelectric convertor layer 612 (612x, 612y and 612z).

As a stress or force, F(t), is applied to the multilayer structure 611 comprising the piezoelectric convertor layer 612; and proximal first and second piezoresistive layers 613, 615, a field forms at both faces of the piezoelectric material 612x, forcing accumulation of charge in the two metallic layers 612y, 612z sandwiching the piezoelectric layer 612x. Since the first positive piezoresistive layer conducts well under mechanical stress (e.g. compression), whereas the negative piezoresistive layer does not conduct well, current flow is directed towards the right storage branch 631 of the circuit, and the intrinsic capacitance $C_P$ of the piezoelectric convertor layer 612 can charge up by moving charge to/from the storage capacitor 632, $C_L$ of the storage circuit portion 631 (current through the higher-impedance load is negligible). When the pressure is released, the capacitance $C_P$ of the piezoelectric convertor layer 612 wants to discharge, yet it now finds the path to the right storage circuit portion 631 blocked as the positive piezoresistive layer 613 has reduced conductivity. At the same time, however, the negative piezoresistive layer 615 turns into a more conductive state and thus allows current to preferentially flow on the left equalizing circuit portion 621. It can be seen that the equivalent circuit of this device is similar of that in FIG. 1, with the diodes being replaced by the positive piezoresistive and negative piezoresistive layers.

A piezoresistive layer is not a genuine electrical diode, as its conductivity imbalance is driven by mechanical stress and not by the electrical bias applied across it. However, in this particular apparatus, any reverse in bias always occurs in phase with the application of stress, with the piezoelectric material acting as transducer. Therefore, the layer is found in the conductive state for one current polarity only, mimicking the behaviour of a semiconductor diode.

The positive piezoresistive layer may comprise a conductor-insulator composite such as carbon nanotube/PDMS, graphene/polymer, metal nanowire/polymer or a force-sensitive rubber or a quantum tunneling composite.

The second negative piezoresistive layer 615, in this case, comprises doped graphene in direct contact with the piezoelectric convertor, the resistance of the doped graphene being configured to change in response to an electric field being generated by the piezoelectric convertor in response to deformation. It will be appreciated that other negative piezoresistive layers may be used.

Figure 7A:
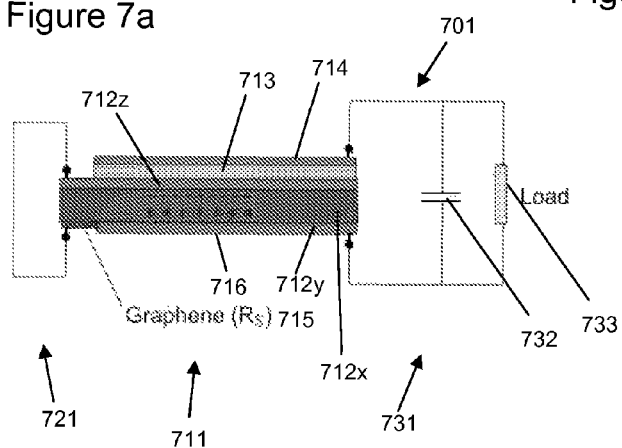
FIGS. 7a and 7b depict two views of a further energy-harvesting device based on piezoresistive materials.

A further embodiment 701 is shown in cross-section in FIG. 7a and from below in FIG. 7b. In this case, unlike the situation in FIG. 6a, the graphene negative piezoresistive layer does not entirely cover the surface of the piezoelectric convertor.

Graphene may show good electrical conductivity coupled with a field-effect response typical of semiconductors. This may allow $R_S$ to be variable resistor, whose state varies in phase with the application of stress. Now, if graphene is appropriately doped at rest (p-type in FIGS. 7a and 7b), it is possible to use the voltage generated by the polyvinylidene difluoride (PVDF) upon pressure as a "gate" to bring the graphene closer to the Dirac point, where its conductivity may be reduced. ON/OFF ratios from 2 to 5 may be possible.

Figure 7B:
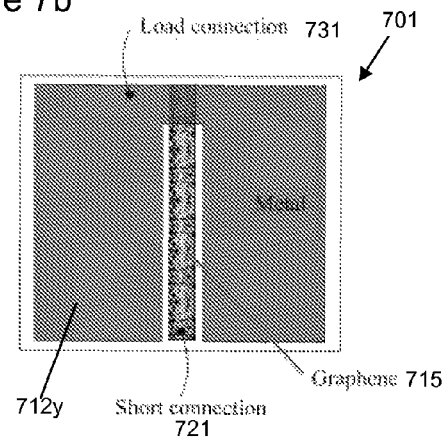

It will be appreciated that the adjusting the area of the graphene layer, as shown in FIG. 7b, may allow the required range for $R_S$ to be selected. For example, since the sheet resistance of single-layer graphene is roughly 1 kΩ/square, a stripe 100 μm wide and a couple of cm long may yield a series resistor of ~200 kΩ.

Advantages of the above described embodiments may include that wide operational ranges (e.g. of currents and/or voltages) resulting from very small to very large forces may be accommodated. In addition, there may be a lower or no threshold voltage as for conventional diodes. As the resistive layer may be integrated with the piezoelectric convertor layer there may be potential for effective and low-cost manufacturability via full integration into a thin and soft layered structure.

It will be appreciated that the above described embodiments may be used to harvest kinetic energy from the human body. For example, such embodiments may be embedded in walkways or shoes to recover the energy of footsteps. Energy harvesting devices may also be configured to harness energy from leg and arm motion, shoe impacts, and blood pressure. A microbelt energy harvesting device may be used to gather electricity from respiration.

Figure 8:
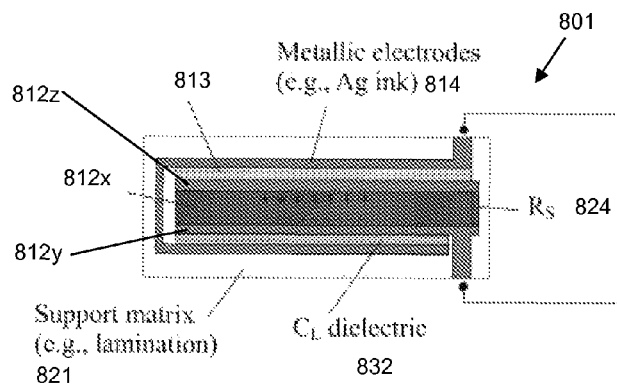
FIG. 8 shows an example embodiment of a fully-integrated "soft" device (comprising the load capacitor CL) that can be manufactured entirely via printing and lamination.

Regarding fabrication, an integrated embodiment 801 as shown in FIG. 8 may be fabricated by lamination of two sub-structures: the first sub-structure comprises a piezoelectric convertor layer 812 (812x, 812y and 812z) comprising the first 812y and second conductive layers 812z with the piezoelectric substrate 812x (which, in this case, comprises polyvinylidene difluoride (PVDF)) in between; the second sub-structure comprises a third conductive layer 814 and the piezoresistive layer 813. Polyvinylidene difluoride (PVDF) may be supplied as a flexible, thin-film substrate on a reel and the formation of the first and second conductive layers may be achieved using printing techniques. In the cases where graphene forms part of the first and/or second conductive layers 812y, 812z then this may be achieved by lamination.

The piezoresistive material may be supplied as a printable ink/paste and fabrication may be by a combination of printing and lamination.

It may be possible to directly screen-print the piezoresistive material (such as a piezoresistive ink) on top of a conductive layer 812y, 812z of the piezoelectric convertor layer 812 (812x, 812y and 812z) and subsequently print the third conductive layer 814 on top of this piezoresistive layer. Additionally, alternative piezoresistive materials may be supplied as a substrate to allow direct printing of the third conductive layer 814 on top.

The conductive layers 812y, 812z, 814 may be formed from any suitable material including, and not limited to, silver nanoparticle ink, graphene ink, monolayer graphene, carbon black ink, copper nanoparticle ink.

Finally, integrating a flexible storage capacitor 832 with a polymer electrolyte is also known, as shown in the fully layered structure in FIG. 8; capacitances from a few µF to several mF may be achievable. The equalizing resistor Rs 824 is also provided between the conductive layers 812y, 812z of the piezoelectric convertor layer 812. In this way, the element may be manufactured as a single laminated foil without any external circuitry, for example using roll-to-roll production.

EXPERIMENTAL DATA

Figure 9:
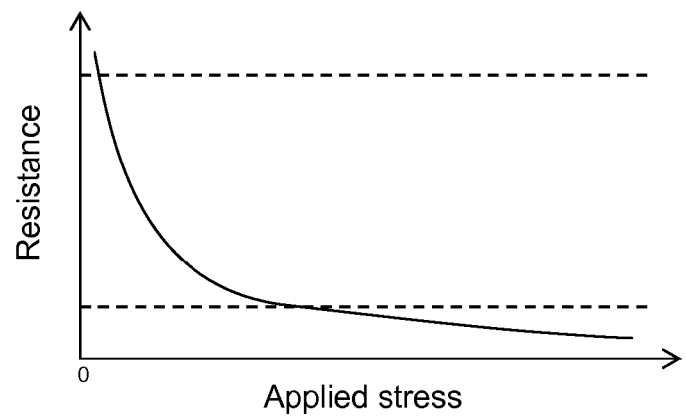
FIG. 9 shows the resistance vs force relationship for a positive piezoresistive layer.

FIG. 9 shows the resistance vs force relationship for a generalized piezoresistive material which may be suitable for the piezoresistive layer. Exemplary characteristics may be that in the unstressed case, the resistance is >100 MΩ, and when a pressure of ~1 kPa is applied, the resistance may drop to <10 kΩ.

It can be seen that both the force range and the operating voltage range are quite extensive and largely compatible with the output of polyvinylidene difluoride (PVDF) piezoelectric material. The force range and operating voltage range may be further extended into the "high pressure limit" by making the layer thicker.

Also, the ON state resistance is low even at very low stress. That is, the material may exhibit a resistance of a few kΩ with forces as low as 0.5-1 N. With no force applied, the OFF state resistance of the piezoresistive layer is >100 MΩ. These numbers may be compatible with the performance of a typical diode, with the major advantage that there may not be threshold voltage limiting the transport at low bias.

Regarding the maximum current allowed through the piezoresistive material we note that under large forces the piezoconvertor layer may generate voltages of around tens of Volts while the resistivity of piezoresistive material can drop below 1 kΩ (I=V/R=10V/1 kΩ=10 mA). Assuming an element with an area of 10 cm² (realistic for applications dealing with several kPa of stress), the current density in the piezoresistive material could reach peaks of 1 mA/cm² or more. For these "heavy duty" applications, however, and additional limiting resistor (say, 50 kΩ) may be connected in series with the piezoresistive material keeping the current within the desired range, and the total ON resistance of the piezoresistive layer still well below $R_S$.

Simulation

Models of the apparatus presented in FIG. 8-11 are included here in order to illustrate the practical implementation of embodiments.

Figure 10:
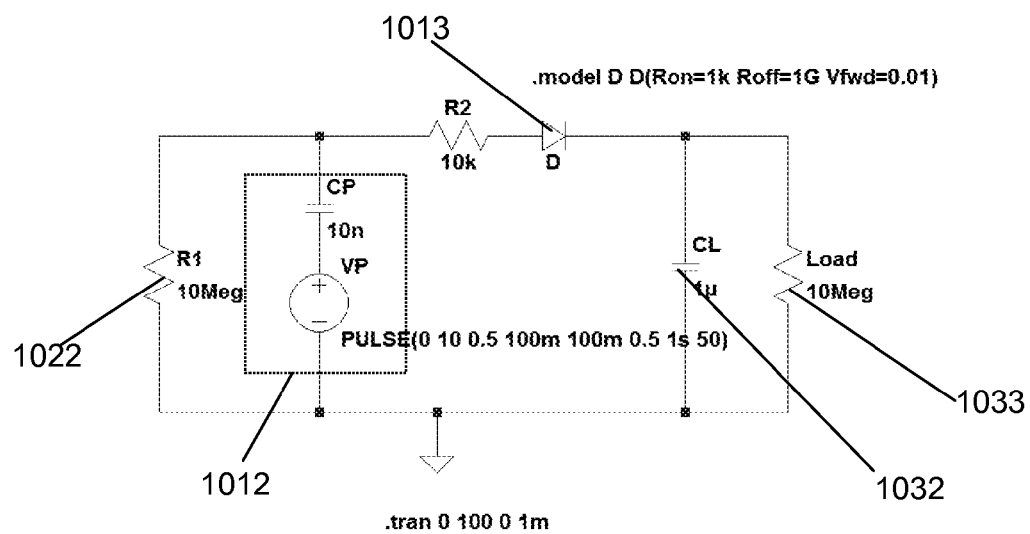
FIG. 10 is a model circuit for simulating how current and voltages are created as the embodiment is repeatedly deformed.
Figure 11:
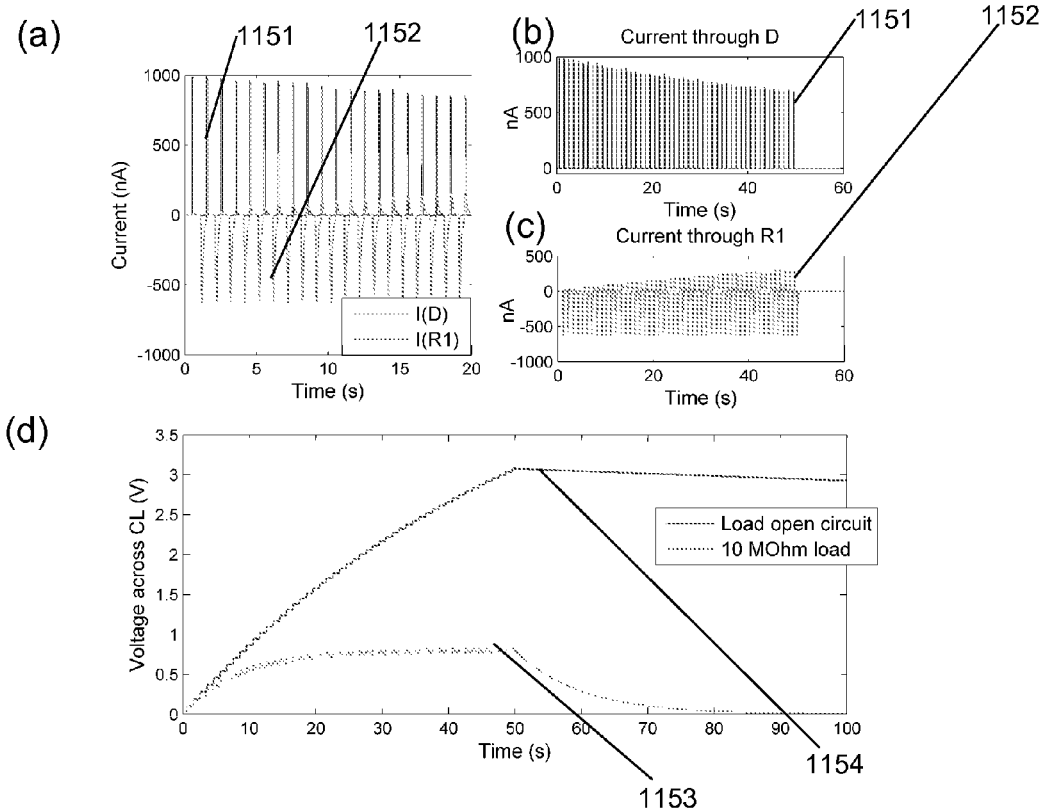
FIGS. 11a-11d are simulation results for an ideal device in the limit of high-stress and low-frequency.

A circuit schematic for the simulations is shown in FIG. 10. The piezoelectric convertor layer 1012 was modelled as the series combination of $V_P$ and $C_P$, where an profile of $V_P(t)$ is a square wave, amplitude 10V, frequency 1 Hz with rise and fall times of 10 ms. This profile may be considered to be consistent with the excitation generated as a result of the impact on a shoe through walking. The positive piezoresistive layer 1013 was modelled as a diode, with an ON resistance of 1 kΩ, an OFF resistance of 1 GΩ, and a threshold voltage of 10 mV. A transient analysis was run for 100 seconds. The circuit further comprises a storage capacitor 1032 in parallel with a load resistor 1033 which is connected to the piezoelectric convertor layer 1012 via the positive piezoresistive layer 1013. An equalizing resistor 1022 is connected directly to the piezoelectric convertor layer 1012.

In a first simulation the circuit without the load resistor 1033 was simulated and the open circuit voltage across $C_L$ monitored. FIG. 11a shows the current flowing through the positive piezoresistive layer 1151 and the equalizing resistor R1, 1152 during the first 20 seconds. The corresponding data up until 60 seconds is shown separately in FIGS. 11b and 11c. As the piezoelectric stack is compressed (on the rise of the square wave), $C_P$ is charged up predominantly by current flow through the positive piezoresistive layer, partially charging the storage capacitor $C_L$ with each cycle. As the piezoelectric stack is released (on the fall of the square wave), $C_P$ discharges through equalizing resistor R1 (creating an effective negative current through R1).

As $C_L$ accumulates charge (and Voltage across $C_L$ increases), as shown by the top curve 1153 in FIG. 11d, the magnitude of the current during each compression is reduced, see FIG. 11b. The open circuit potential across $C_L$ is shown to saturate and once the compression cycles cease, at time=50 s, $C_L$ discharges slowly through the piezoresistive layer which in this simulation has an effective 1 GΩ resistance.

FIG. 11d also shows the accumulation of a voltage across $C_L$ in the case where a 10 MΩ load is added in parallel to $C_L$. On each compression cycle, a greater discharge current flows through the load and hence the saturation potential is reduced from the open circuit case.

Figure 12:
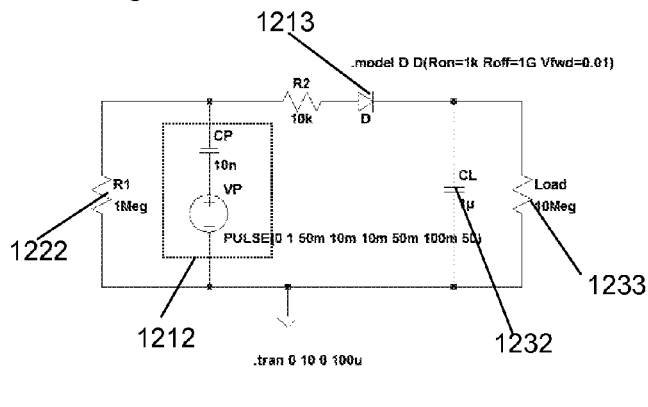
FIG. 12 is a model circuit for simulating how current and voltages are created as the embodiment is repeatedly deformed.
Figure 13:
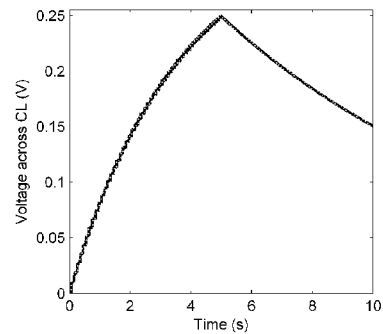
FIG. 13 show simulation results for an ideal device in the limit of low-stress and high-frequency.

FIG. 12 shows the circuit wherein the piezoelectric multilayer structure is subject to a smaller pressure but at a higher frequency (10 Hz), more consistent with what might be achieved by finger presses. The associated potential generated by the piezoelectric material is reduced to 1V to account for the reduced pressure possible from finger presses. FIG. 13 shows the accumulation of potential and subsequent discharge for the circuit of FIG. 12. The transient analysis was run here for 5 seconds only because of the reduced potential of the piezoelectric material.

Like the previous simulation circuit, the piezoelectric convertor layer 1212 was modelled as the series combination of $V_P$ and $C_P$; and the positive piezoresistive layer 1213 was modelled as a diode. The circuit further comprises a storage capacitor 1232 in parallel with a load resistor 1233 which is connected to the piezoelectric convertor layer 1212 via the positive piezoresistive layer 1213. An equalizing resistor 1222 is connected directly to the piezoelectric convertor layer 1212.

The parameters within the apparatus may be optimised for a particular application. If, for instance, charge accumulation is to occur over a prolonged period of time with only occasional discharge through a load (e.g., to communicate wirelessly a sensor response at well-spaced intervals), then the use of a large $C_L$ may ensure sufficient capacity to supply a short but high-power burst. Conversely, a smaller $C_L$ may be more appropriate for the cases where continuous discharge through the load is required and the saturation voltage must be reached quickly (e.g., to charge a battery).

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry may have other functions in addition to the mentioned functions, and that these functions may be performed by the same apparatus/circuitry. One or more disclosed aspects may encompass the electronic distribution of associated computer programs and computer programs (which may be source/transport encoded) recorded on an appropriate carrier (e.g. memory, signal).

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
   a piezoelectric convertor layer; and
   a proximal first piezoresistive layer being in electrical communication with, a first face of the piezoelectric convertor layer,
   the apparatus being configured such that when the piezoelectric convertor layer is deformed to generate charge, the proximal piezoresistive layer is configured to control the flow of charge from the piezoelectric convertor layer.

2. An apparatus according to claim 1, wherein the proximity of the piezoelectric convertor layer and the piezoresistive layer is such that the electric field generated by the deformation of the piezoelectric convertor layer causes a change in the resistance of the piezoresistive layer compared to the non-deformed state to thereby control the flow of charge from the piezoelectric convertor layer.

3. An apparatus according to claim 1, wherein the proximity of the piezoelectric convertor layer and the piezoresistive layer is such that they are in physical contact so that the deformation of the piezoelectric convertor layer causes a deformation in the piezoresistive layer to change the resistance of the piezoresistive layer compared to the non-deformed state to thereby control the flow of charge from the piezoelectric convertor layer.

4. The apparatus of claim 1, wherein the apparatus is configured such that the resistance of the first piezoresistive layer decreases in response to compression applied to the piezoelectric convertor layer.

5. The apparatus of claim 1, wherein the first piezoresistive layer comprises a quantum tunneling composite.

6. The apparatus of claim 1, wherein the first piezoresistive layer comprises doped graphene in direct contact with the piezoelectric convertor layer, the resistance of the doped graphene being configured to change in response to an electric field being generated by the piezoelectric convertor layer in response to deformation.

7. The apparatus of claim 1, wherein the piezoelectric convertor layer and the first piezoresistive layer are configured to be transparent.

8. The apparatus of claim 1, wherein the piezoelectric convertor layer comprises:
   a piezoelectric layer;
   a first conducting layer in direct electrical communication with the first face of a piezoelectric layer; and
   a second conducting layer in direct electrical communication with the opposing second face of the piezoelectric layer.

9. The apparatus of claim 1, wherein the apparatus comprises:

a first circuit portion electrically connected to:
the first face of the piezoelectric convertor layer via the first piezoresistive layer; and
the opposing second face of the piezoelectric convertor, the first circuit portion being configured to store charge generated by the piezoelectric convertor layer; and
a second circuit portion connected to:
the first face of the piezoelectric convertor layer; and
the opposing second face of the piezoelectric convertor layer,
the second circuit portion being configured to enable charge to be equalized between the opposing first and second faces of the piezoelectric convertor layer.

10. The apparatus of claim 9, wherein the first circuit portion comprises a storage capacitor configured to store the charge from the piezoelectric convertor layer.

11. The apparatus of claim 9, wherein the second circuit comprises a resistor, the resistor being configured to resist charge equalization between the opposing first and second faces of the piezoelectric convertor layer.

12. The apparatus of claim 9, wherein the apparatus is configured such that:
the resistance of the first piezoresistive layer is less than the resistance of the resistor when the piezoelectric convertor layer is compressed; and
the resistance of the first piezoresistive layer is greater than the resistance of the resistor when the piezoelectric convertor layer is not compressed.

13. The apparatus of claim 1, wherein the apparatus comprises a second piezoresistive layer overlying, and being in electrical communication with, the opposing second face of the piezoelectric convertor layer.

14. The apparatus of claim 13, wherein the apparatus is configured such that the resistance of the second piezoresistive layer increases in response to compression of the piezoelectric convertor layer.

15. The apparatus of claim 13, wherein the second piezoresistive layer comprises doped graphene in direct contact with the piezoelectric convertor, the resistance of the doped graphene being configured to change in response to an electric field being generated by the piezoelectric convertor in response to deformation.

16. The apparatus of claim 13, wherein the apparatus comprises:
a first circuit portion electrically connected to:
the first face of the piezoelectric convertor layer via the first piezoresistive layer; and
the opposing second face of the piezoelectric convertor, the first circuit portion being configured to store charge generated by the piezoelectric convertor layer; and
a second circuit portion connected to:
the first face of the piezoelectric convertor layer; and
the opposing second face of the piezoelectric convertor layer via the second piezoresistive layer,
the second circuit portion being configured to enable charge to be equalized between the opposing first and second faces of the piezoelectric convertor layer.

17. The apparatus of claim 1, wherein the extent of the piezoresistive layer is smaller than the extent of the piezoelectric convertor layer.

18. The apparatus of claim 1, wherein the apparatus comprises a plurality of discrete, spaced apart first piezoresistive layers arranged in proximity with a common piezoelectric convertor layer.

19. The apparatus of claim 1, wherein the apparatus is or forms part of a touch screen, a touch screen pixel, a shoe, a watch, an item of clothing, a portable electronic device, or a mechanical energy collecting device.

20. A method of manufacturing an apparatus, the method comprising:
providing a piezoelectric convertor layer; and
providing a proximal first piezoresistive layer being in electrical communication with, a first face of the piezoelectric convertor layer,
the apparatus being configured such that when the piezoelectric convertor layer is deformed to generate charge, the proximal piezoresistive layer is configured to control the flow of charge from the piezoelectric convertor layer.

21. A method comprising:
generating charge, by a piezoelectric convertor layer being deformed,
wherein a first face of the piezoelectric convertor layer is in electrical communication with a proximal first piezoresistive layer; and
wherein in response to a deformation of the piezoelectric convertor layer the proximal piezo resistive layer is deformed and thereby controls the flow of charge from the piezoelectric convertor layer.

* * * * *